United States Patent [11] 3,615,950

[72] Inventor Rodolphe Lacal
Monza, Italy
[21] Appl. No. 816,301
[22] Filed Apr. 15, 1969
[45] Patented Oct. 26, 1971
[73] Assignee U.S. Philips Corporation
New York, N.Y.
[32] Priority Apr. 19, 1968
[33] France
[31] 148719

[54] METHOD OF ETCHING SILVER-TIN-LEAD CONTACTS ON A NICKEL COATED BASE

4 Claims, 6 Drawing Figs.

[52] U.S. Cl. 156/3, 156/6, 156/17, 156/18, 252/79.4
[51] Int. Cl. H01l 7/00, H01l 7/50, C23f 1/00
[50] Field of Search 156/3, 13, 17, 18; 148/185; 252/79.4, 79.5

[56] References Cited

UNITED STATES PATENTS 1,484,690 2/1924 Walker et al. 134/2 X

*Primary Examiner*—Jacob H. Steinberg
*Attorney*—Frank R. Trifari

ABSTRACT: A method of chemically etching away lead-tin-silver alloy layers from a base in which the body is dipped in a solution of ammonia and an ammonium salt and then etched in a solution of hydrogen peroxide and an acid.

Figure 1:
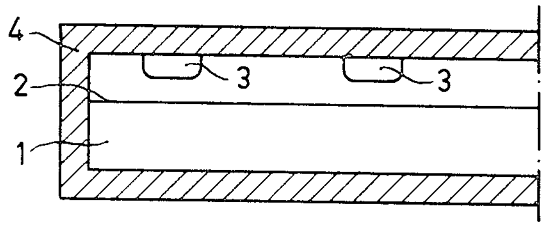

INVENTOR.

RODOLPHE LACAL

BY

Frank R. Trifari

AGENT

INVENTOR.
RODOLPHE LACAL
BY
AGENT

METHOD OF ETCHING SILVER-TIN-LEAD CONTACTS ON A NICKEL COATED BASE

This invention relates to a method of chemical etching away layers of lead-tin-silver alloys from the surface of a body.

For contacts of transistors, particularly silicon transistors, a nickel layer is used which is coated with an eutectic alloy of lead, tin and silver containing 93.8% by weight of lead, 5% by weight of tin and 1.2% by weight of silver, having a melting point of 295° C.

For the manufacture of transistors the basic material is formed by wafers on which simultaneously a plurality of transistors is made by providing by diffusion base-collector junctions and emitter-base junctions.

The contacts are made by masking oxide zones to be retained by a photosensitive lacquer and by providing windows in the oxide layer with the aid of a photosensitive lacquer, in which first nickel is deposited on the surface, on which a layer of the aforesaid eutectic alloy is provided by dipping, the alloy adhering only to metallized zones.

Then the separate semiconductor devices are mechanically severed. This gives rise to irregularities on the lines where the collector-base junctions are lying at the surface, particularly due to particles which give rise to parallel conduction. It is therefore necessary to clean the sides by etching. The newly formed contacts (Sn-Pb-Ag) have, however, to be protected by a photosensitive lacquer before the wafer is cut. After etching the residual lacquer has again to be removed. These operations complicate the process. The same zone is twice outlined by a photoetching process. Each of these photoetching processes comprises the application of the lacquer, the exposure, heating or curing, removing of the nonexposed lacquer and afterwards the removal of the cured lacquer.

An easier method might consist in depositing the metal on the whole surface of the wafer and to subsequently etch away the metal at the respective places.

It is known that Sn-Pb alloys can be dissolved in a mixture of acetic acid and hydrogen peroxide. An Sn-Pb-Ag alloy, however, has the drawback that not all constituents of the alloy dissolve at the same rate. Thus the contours of a pattern obtained by etching become irregular. Sometimes metal fragments are left, which may produce short circuits.

The present invention provides a pretreatment of lead-tin-silver layers, which obviates said disadvantages.

The method of selective removing chemically layers of lead-tin-silver alloys with the aid of a solution of acetic acid and hydrogen peroxide is preceded in accordance with the invention by immersion in a solution containing ammonium bicarbonate and ammonia.

It is preferred to use a pretreatment mixture formed by equal volumes of a solution of ammonium bicarbonate and concentrated ammonia saturated at room temperature. The treatment is preferably carried out at room temperature for 5 to 10 minutes. This composition matches particularly the aforesaid eutectic alloy. The composition of the mixture may, however, be varied by about 50 percent within wide limits without losing its activity. Other ratios are employed for alloys of a different composition.

The invention is based on the solubility of lead bicarbonate and on the property of ammonium salts to facilitate the solution of silver while ammonium complexes are formed. The liquid for the pretreatment dissolves the oxide layer on the surface of the alloy.

The results obtained are further improved by adding to the etchant formed by acetic acid and hydrogen peroxide a surface-active substance and a buffer mixture. Thus the etching rate is controlled. The buffer is preferably formed by a soluble acetate and the surface-active substance is a sulphonated lauryl alcohol, preferably of the following compositions:

| | |
|---|---|
| acetic acid | 80 ml. |
| sodium acetate | 5 g. |
| hydrogen peroxide solution (30%) | 50 ml. |
| sulfonated lauryl alcohol | 15 or 20 mg. |
| water | 40 ml. |

The pretreatment according to the invention may be employed for manufacturing layers of silver-tin-lead-solder according to a given pattern, for removing such solder layers, to restore the constituents and to manufacture contacts on printed wiring and on semiconductor devices.

The present invention has the advantage that by the pretreatment the silver-tin-lead layer is etched much more regularly and completely. There is no residue dissolving at a lower rate.

It should be noted that the use of ammonium bicarbonate is essential; other alkaline bicarbonates, for example, sodium bicarbonate have a considerably lower effect.

By way of example and with reference to the accompanying drawings the manufacture of contact zones on silicon transistors will now be described.

FIGS. 1 to 6 illustrate various stages of the manufacture of transistors.

Figure 2:
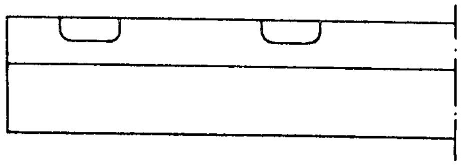

FIG. 1 shows a wafer 1, on which the junctions 2 and 3 are previously provided by consecutive diffusions; the junction 2 is the base-collector junction and the junction 3 is the base-emitter junction. The wafer is coated with a silica layer 4, which is removed in known manner by etching with a mixture of hydrofluoric acid and ammonium fluoride. The resultant wafer is shown in FIG. 2.

Figure 3:
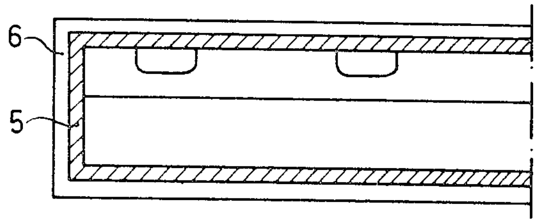

The wafer is then covered completely in known manner with three nickel layers, 5, the latter containing preferably phosphorus and having a thickness of 0.12$\mu$ on N-type silicon and of 0.05$\mu$ on P-type silicon. Then a layer of the alloy of the following composition by weight is applied:

93.8% of Pb, 5% of Sn, 1.2% of Ag by dipping in the alloying bath heated at 350° C. The wafer in this stage is illustrated in FIG. 3, in which the alloy layer is designated by 6.

The alloy and nickel layers are protected by a mask 7 of light-sensitive lacquer at the places where the layers have to be maintained, that is to say in the zones 8 for the emitter contacts, 9 for the base contacts and on the whole surface 10 for the collector contacts.

The wafer is then dipped for 5 to 10 minutes in a mixture of equal volumes of a saturated solution of ammonium bicarbonate and concentrated ammonia at room temperature.

The wafer is subsequently dipped for about 2 minutes at room temperature in the etchant of the following composition:

| | |
|---|---|
| water | 40 ml. |
| acetic acid | 80 ml. |
| sodium acetate | 5 g. |
| hydrogen peroxide (30%) | 50 ml. |
| sulfonated lauryl alcohol | 15 or 20 mg. |

The bath is constantly stirred.

Figure 4:
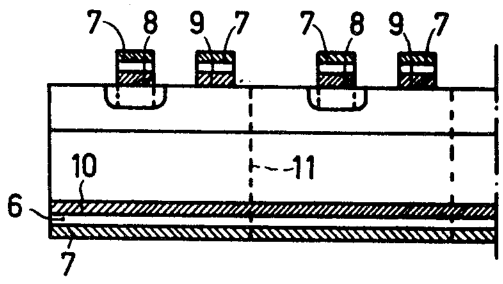

The wafer is then flushed in deionized water and then dried. In this stage it is shown in FIG. 4.

Figure 5:
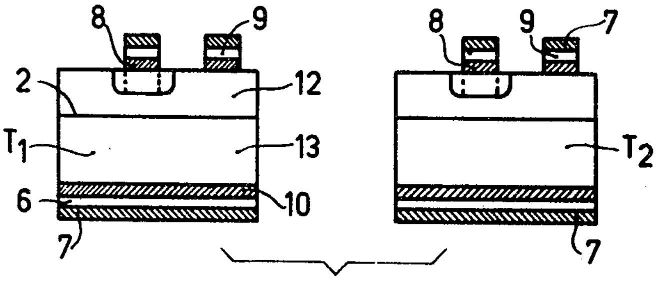

The transistors T are then severed from each other, for example, by scratching with diamond and subsequent ultrasonic vibrations or by braking up under pressure. FIG. 5 shows two resultant transistors $T_1$ and $T_2$.

THen the transistors are etched, in which case particularly the zone 12, where the junction 2 is adjacent the surface 13, is important. Etching is performed by dipping in a bath of the following composition:

| | |
|---|---|
| hydrofluoric acid (48 to 50%) | 3 ml. |
| nitric acid ($D$=1.38) | 50 ml. |

Figure 6:
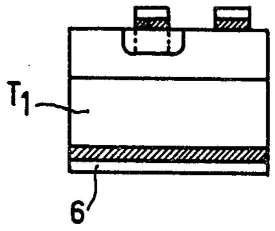

Finally the layer of light-sensitive lacquer is removed by one of the conventional solvents. The transistors in this stage are shown in FIG. 6. They have clean, smooth edges. The extent of underetching of the masking layer is considerably reduced as compared with the known method.

What is claimed is:

1. A method of selectively removing layers of an alloy of lead, tin and silver from the surface of a photomasked nickel layer on a silicon base comprising the steps of dipping said body into a mixture of a concentrated aqueous solution of ammonium bicarbonate and from 50 to 100 percent by volume of an aqueous solution of ammonia, saturated at room temperature, and then etching said nickel layer in an etching bath comprising an aqueous solution of acetic acid and hydrogen peroxide.

2. The method of claim 1 wherein the mixture contains equal volumes of the ammonium bicarbonate solution and the ammonia solution and the time is for about 5 to 10 minutes.

3. The method of claim 1 wherein the etching bath contains in addition a buffer and a surface active substance.

4. The method of claim 3 wherein the surface active substance is a sulfonated lauryl alcohol.

* * * * *